(12) United States Patent
Lee et al.

(10) Patent No.: US 11,160,180 B2
(45) Date of Patent: Oct. 26, 2021

(54) SECURING APPARATUS AND ELECTRONIC DEVICE USING THE SAME

(71) Applicant: HONGFUJIN PRECISION ELECTRONICS (TIANJIN) CO., LTD., Tianjin (CN)

(72) Inventors: Sheng-Hung Lee, New Taipei (TW); Tung-Chun Tsai, New Taipei (TW)

(73) Assignee: HONGFUJIN PRECISION ELECTRONICS (TIANJIN) CO., LTD., Tianjin (CN)

(*) Notice: Subject to any disclaimer, the term of this patent is extended or adjusted under 35 U.S.C. 154(b) by 0 days.

(21) Appl. No.: 16/839,316

(22) Filed: Apr. 3, 2020

(65) Prior Publication Data
US 2021/0307184 A1 Sep. 30, 2021

(30) Foreign Application Priority Data

Mar. 25, 2020 (CN) .......................... 202010219252.9

(51) Int. Cl.
*H05K 5/02* (2006.01)
(52) U.S. Cl.
CPC ......... *H05K 5/0221* (2013.01); *H05K 5/0208* (2013.01)

(58) Field of Classification Search
CPC .................................................... H05K 7/1409
See application file for complete search history.

(56) References Cited

U.S. PATENT DOCUMENTS

2010/0132419 A1 6/2010 Wen-Wei et al.
2013/0130528 A1* 5/2013 Jun ...................... H05K 7/1409
439/160

FOREIGN PATENT DOCUMENTS

TW 201022885 A 6/2010

* cited by examiner

*Primary Examiner* — Jerry Wu
(74) *Attorney, Agent, or Firm* — ScienBiziP, P.C.

(57) ABSTRACT

A securing apparatus for use with a fastening member includes a bracket and a locking member. The locking member is rotatably disposed on the bracket. The locking member includes a clamping portion and a handle, the clamping portion is used to cooperate with the locking member. By operating the handle, the locking member is rotated, so that the clamping portion is engaged with the locking member and the clamping portion is disengaged from the locking member.

16 Claims, 7 Drawing Sheets

SECURING APPARATUS AND ELECTRONIC DEVICE USING THE SAME

FIELD

The subject matter herein generally relates to securing apparatus.

BACKGROUND

Pads are used to lock the panel of the electronic device and the main casing. A unique or high-security key is required when unlocking the electronic device, which makes disassembling the case cumbersome.

Therefore, an improvement is desired.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Figure 1:
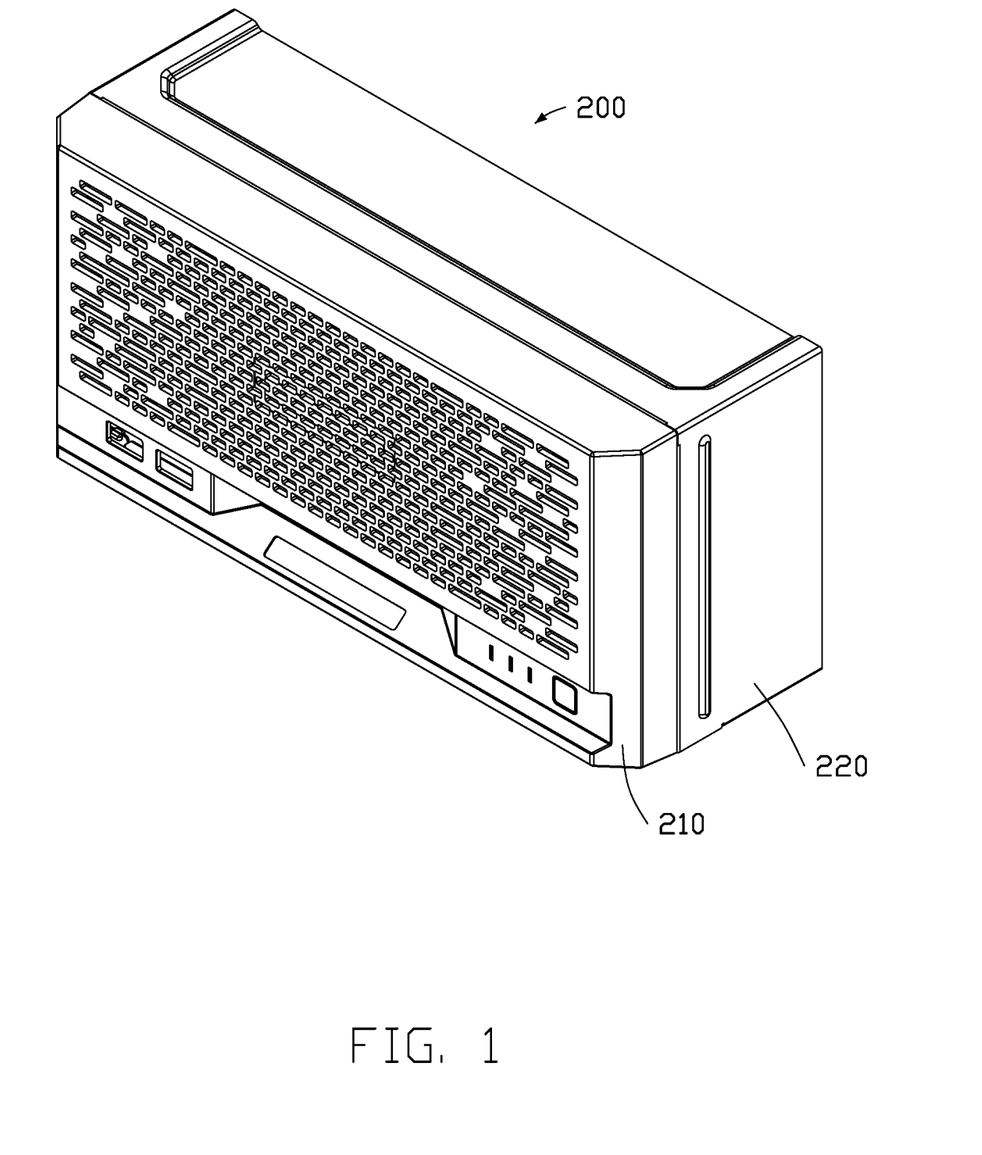
FIG. 1 is a schematic diagram of an embodiment of an electronic device of the present disclosure.
Figure 2:
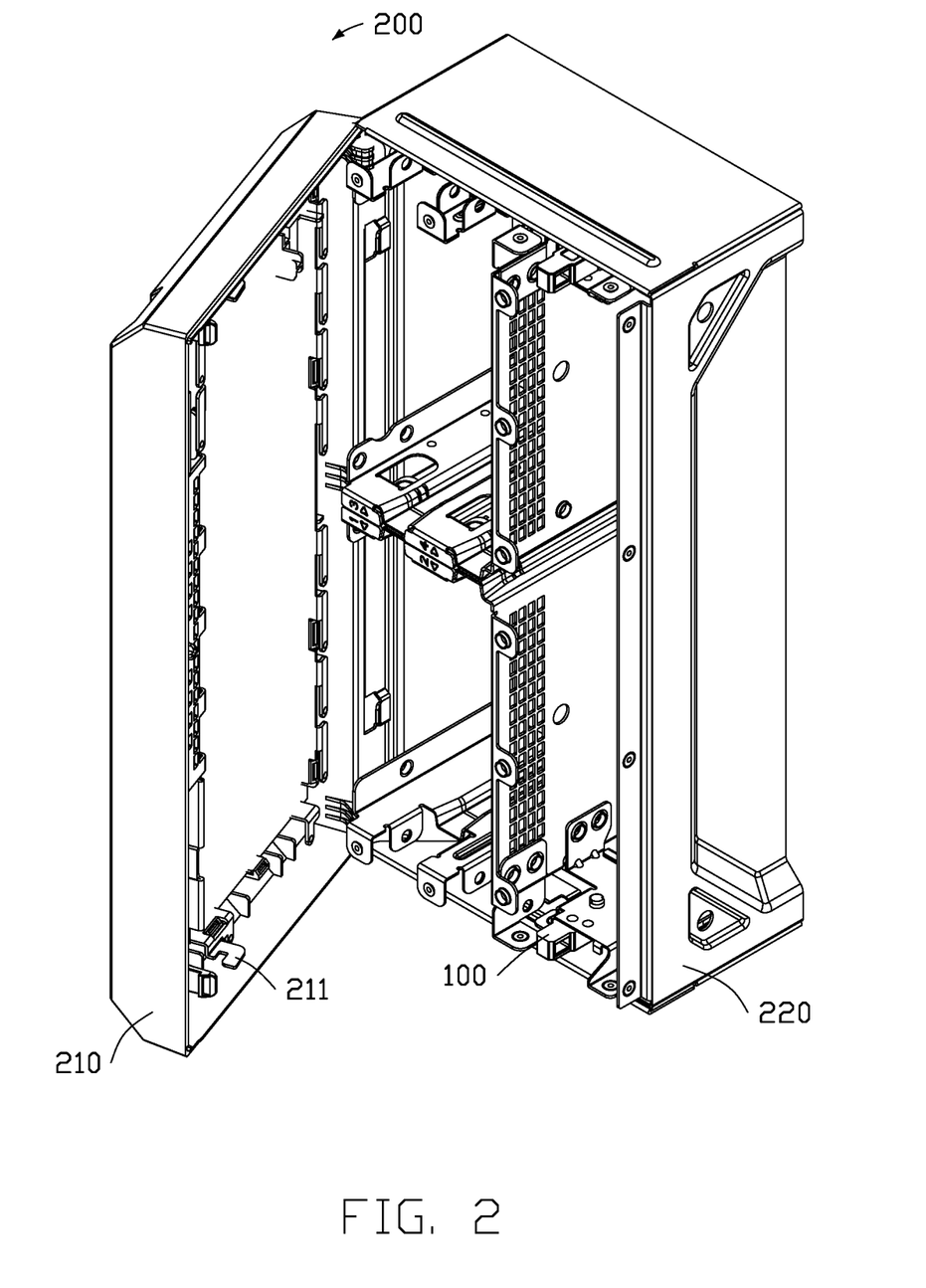
FIG. 2 is a schematic diagram of the electronic device in an opened state.

FIGS. 1 and 2 illustrate an electronic device 200 in accordance with an embodiment of the present disclosure. The electronic device 200 includes a securing apparatus 100, a first casing 210, and a second casing 220. A fastening member 211 is disposed inside the first casing 210, and the securing apparatus 100 corresponding to the fastening member 211 is disposed inside of the fixing hole 22. The first casing 210 is fastened to the second casing 220 by buckling the fastening member 211 on the first casing 210 with the securing apparatus 100.

Figure 6:
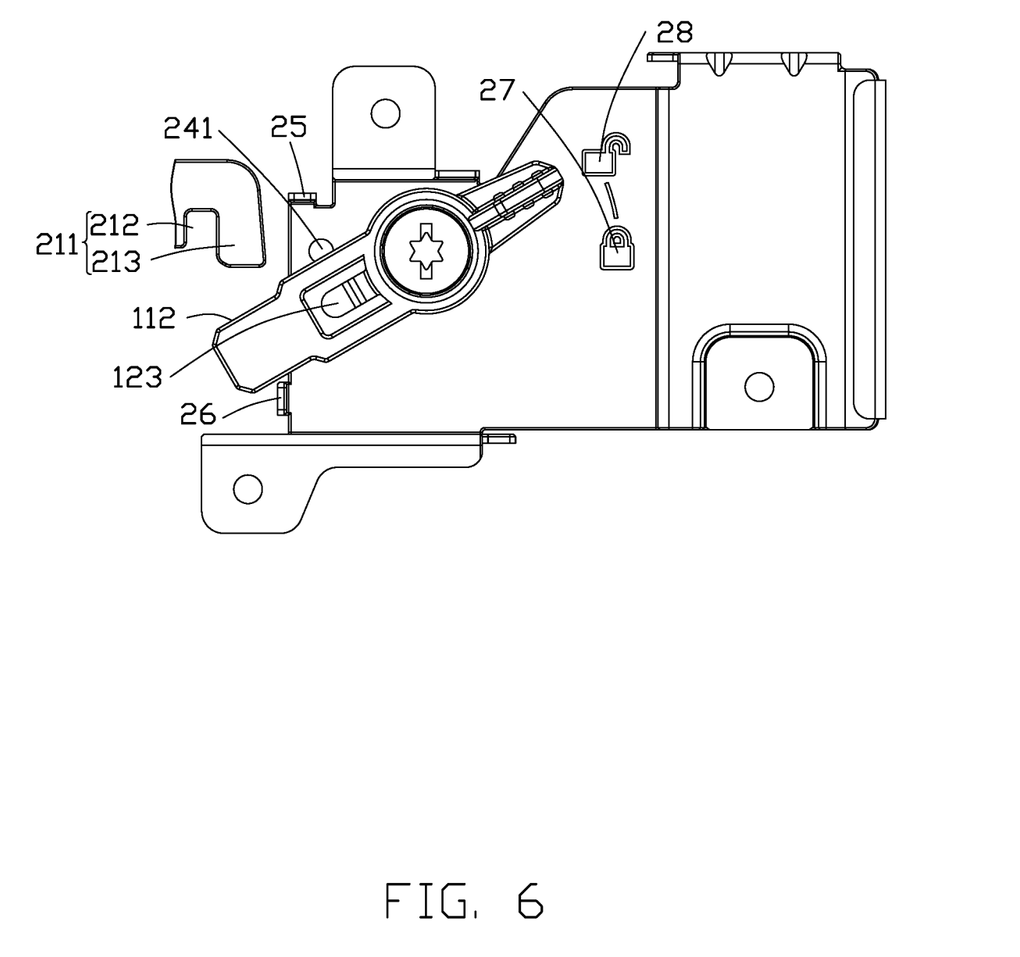
FIG. 6 is a schematic diagram of the securing apparatus in an unlocked state.

Referring to FIG. 6, the fastening member 211 is hook-shaped and partially hollowed out to form a concave groove 212 and an end portion 213. The end portion 213 is formed at an end of the fastening member 211.

Figure 3:
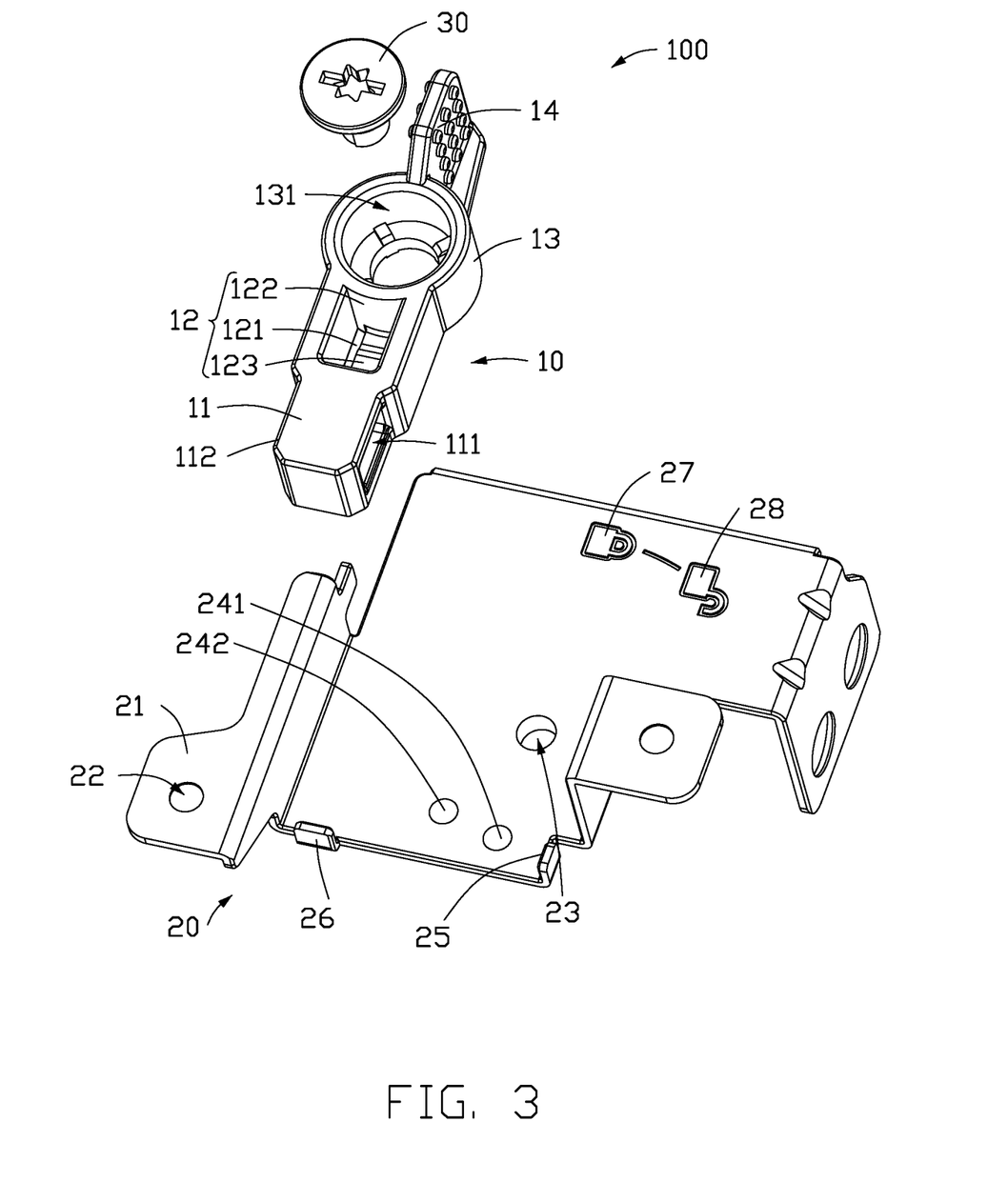
FIG. 3 is an exploded view of an embodiment of a securing apparatus of the present disclosure of FIG. 2.
Figure 4:
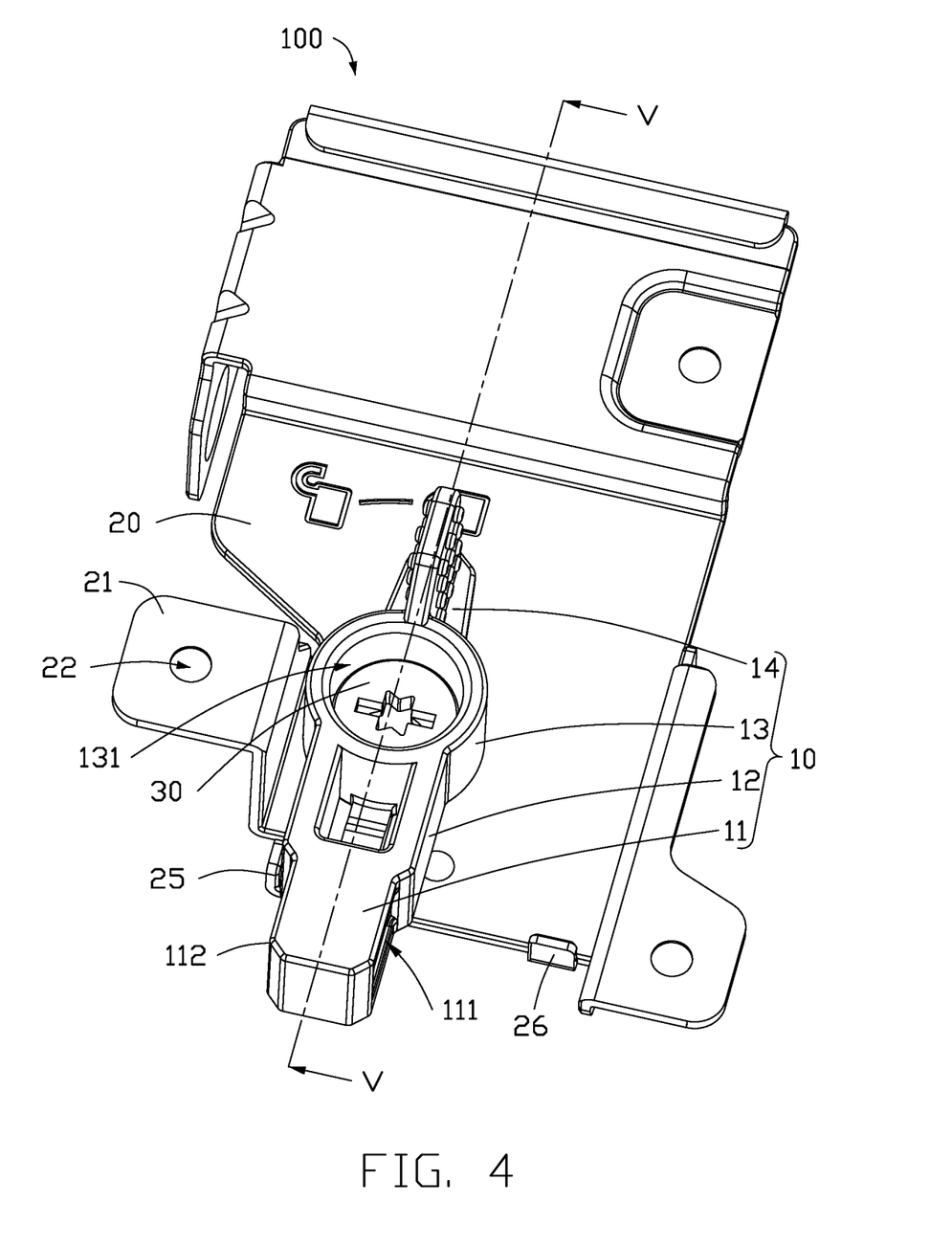
FIG. 4 is a schematic diagram of the assembled securing apparatus of FIG. 3.

FIGS. 3 and 4 illustrate that the securing apparatus 100 includes a locking member 10 and a bracket 20.

The bracket 20 is fixed on the second casing 220, and the bracket 20 is this and substantially rectangular.

Each end of the bracket 20 is provided with a fixing portion 21. Each fixing portion 21 defines a fixing hole 22. The bracket 20 is assembled to the second casing 220 by passing a screw (not shown) through the fixing hole 22. The bracket 20 defines a first mounting hole 23.

The locking member 10 is rotatably disposed on the bracket 20. The locking member 10 includes a clamping portion 11 and a handle 14. The clamping portion 11 is substantially square. The clamping portion 11 defines a clamping hole 111 along a first direction. In the embodiment, the first direction is a direction parallel to the bracket 20. The clamping hole 111 is provided to correspond to the fastening member 211, and a first hole wall 112 is formed. The clamping portion 11 is configured to cooperate with the fastening member 211. When the locking member 10 rotates, the clamping portion 11 is fastened to or separated from the fastening member 211.

When the locking member 10 is rotated, the clamping hole 111 receives the end portion 213, and the concave groove 212 is limited by the first hole wall 112. The locking member 10 and the fastening member 211 are fastened to each other, so that the first casing 210 is fixed on the second casing 220. Similarly, when the locking member 10 is rotated, the clamping portion 11 is away from the fastening member 211, the locking member 10 is unlocked from the fastening member 211, so that the first casing 210 is detachable from the second casing 220.

The handle 14 is in a sheet shape and is disposed on a side of the locking member 10 away from the fastening member 211. By operating the handle 14, the locking member 10 can be rotated, so that the locking member 10 is rotated relative to the bracket 20.

In the embodiment, the locking member 10 further includes a positioning portion 12. The positioning portion 12 is disposed between the clamping portion 11 and the handle 14. The positioning portion 12 is substantially square. A positioning hole positioning hole 121 is defined in the second direction. In the embodiment, the second direction is a direction parallel to the bracket 20. The first direction and the second direction are perpendicular to each other.

The positioning hole 121 is formed with a second hole wall 122.

Figure 5:
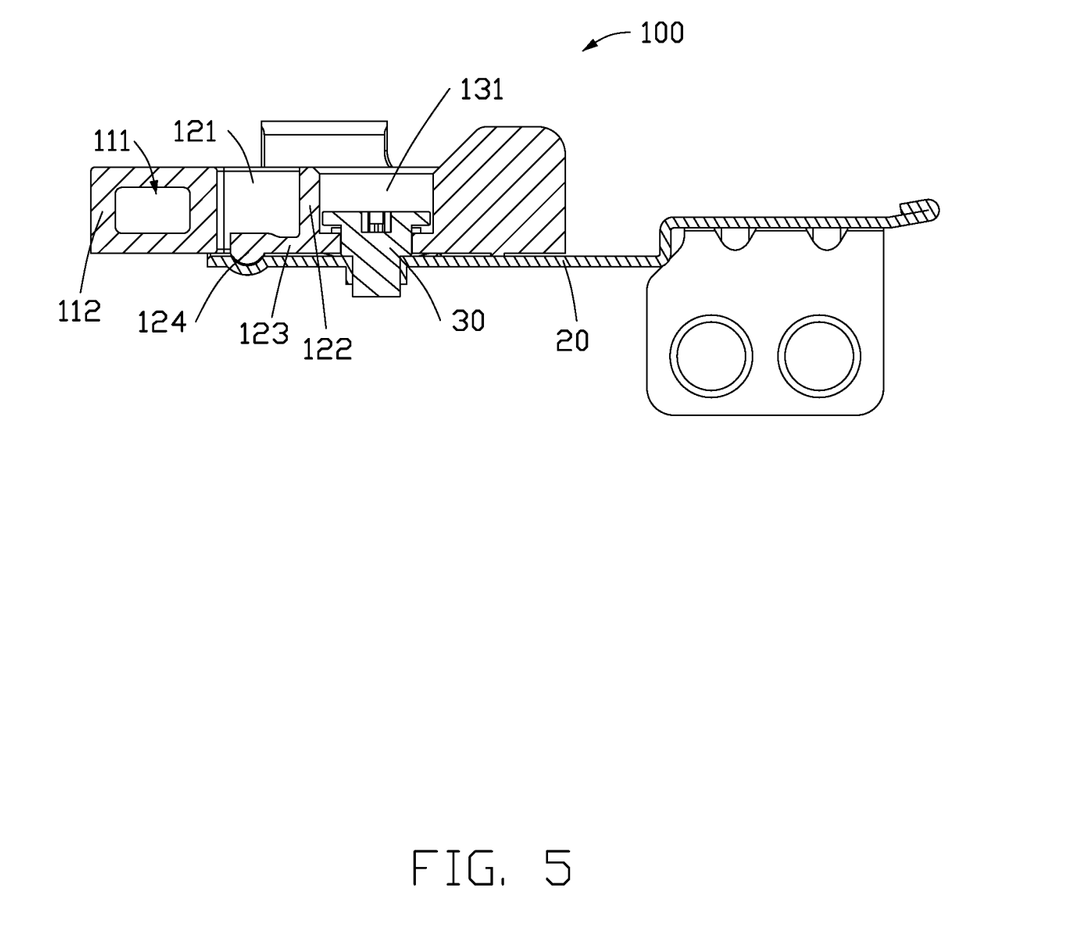
FIG. 5 is a cross-sectional view taken along line V-V of FIG. 4.

Referring to FIG. 5, a tongue piece 123 is formed on the second hole wall 122. In the embodiment, the tongue piece 123 is formed on one side of the second hole wall 122 and extends in a direction close to the clamping portion 11.

When the handle is operated, the locking member 10 is rotated, and the clamping portion 11 is engaged (one way) with the locking member 10 or the clamping portion 11 is disengaged (other way) from the locking member 10.

The tongue piece 123 is made of a plastic material, and the tongue piece 123 has resilience. A positioning member 124 is formed at the end of the tongue piece 123. The length of the tongue piece 123 is smaller than the diameter of the positioning hole 121, and the tongue piece 123 is received in the positioning hole 121. In the embodiment, the positioning member 124 is hemispherical. When the handle 14 is operated to rotate the locking member 10, the tongue piece 123 and the positioning member 124 also rotate relative to the bracket 20.

In the embodiment, the bracket 20 defines a first positioning groove 241 and a second positioning groove 242. The first positioning groove 241 and the second positioning groove 242 are used to receive the positioning member 124, and the locking member 10 is positioned in a fastened state or an unlocked state.

When the end portion 213 is completely received in the clamping hole 111, the positioning member 124 is received in the first positioning groove 241, and the locking member 10 ceases to rotate and is positioned in the fastener state.

When the fastening member 211 is completely separated from the locking member 10, and the end portion 213 is completely separated from the clamping hole 111, the positioning member 124 is received in the second positioning groove 242, so that the locking member 10 is positioned in an unlocked state.

When the positioning member 124 is received in the first positioning groove 241 or the second positioning groove 242, the locking member 10 is no longer rotated. When the handle 14 is operated, the locking member 10 is released from the fastener state or the unlocked state, the positioning member 124 can be released from the first positioning groove 241 or the second positioning groove 242.

The tongue piece 123 has resilience, thereby facilitating the positioning member 124 to be received in the first positioning groove 241 or can be separated from the first positioning groove 241, and prevents excessive wear of the positioning member 124.

The tongue piece 123 may also be formed on the other side wall of the locking member 10 near the bracket 20, and the positioning member 124 on the tongue piece 123 can cooperate with the first positioning groove 241 and the second positioning groove 242. In other embodiments, the positioning portion 12 may be entirely an elastic member, and the positioning member 124 is directly disposed on the positioning portion 12 without being connected by the tongue piece 123.

FIGS. 3 and 4 illustrate that the locking member 10 further includes a mounting portion 13. The mounting portion 13 is substantially circular, and is disposed between the positioning portion 12 and the handle 14 to mount the locking member 10 on the bracket 20. In the embodiment, the mounting portion 13 defines a second mounting hole 131 along the second direction. The second mounting hole 131 is provided to correspond to the first mounting hole 23.

A connecting member 30 passes through the second mounting hole 131 and the first mounting hole 23, the locking member 10 is rotatably disposed on the bracket 20. In the embodiment, the connecting member 30 is a step screw. In addition, when the handle 14 is operated, the locking member 10 rotates relative to the bracket 20 with the connecting member 30 as a rotation axis.

The bracket 20 is further provided with a first resisting portion 25 and a second resisting portion 26. The first resisting portion 25 is disposed on an end of the bracket 20 near the fixing portion 21 of the fastening member 211. The second resisting portion 26 is disposed on one end of the bracket 20 near the other fixing portion 21 of the fastening member 211.

In the embodiment, the first resisting portion 25 and the second resisting portion 26 limit the rotation range and angle of the locking member 10. When the positioning portion 12 of the locking member 10 abuts against the first resisting portion 25, the locking member 10 and the fastening member 211 are in a fastened state. When the positioning portion 12 of the locking member 10 abuts against the first resisting portion 25, the locking member 10 and the fastening member 211 are in an unlocked state. In this way, the rotation range and angle of the locking member 10 can be effectively restricted, and failure of the locking member 10 due to an excessively large rotation angle can be prevented.

Figure 7:
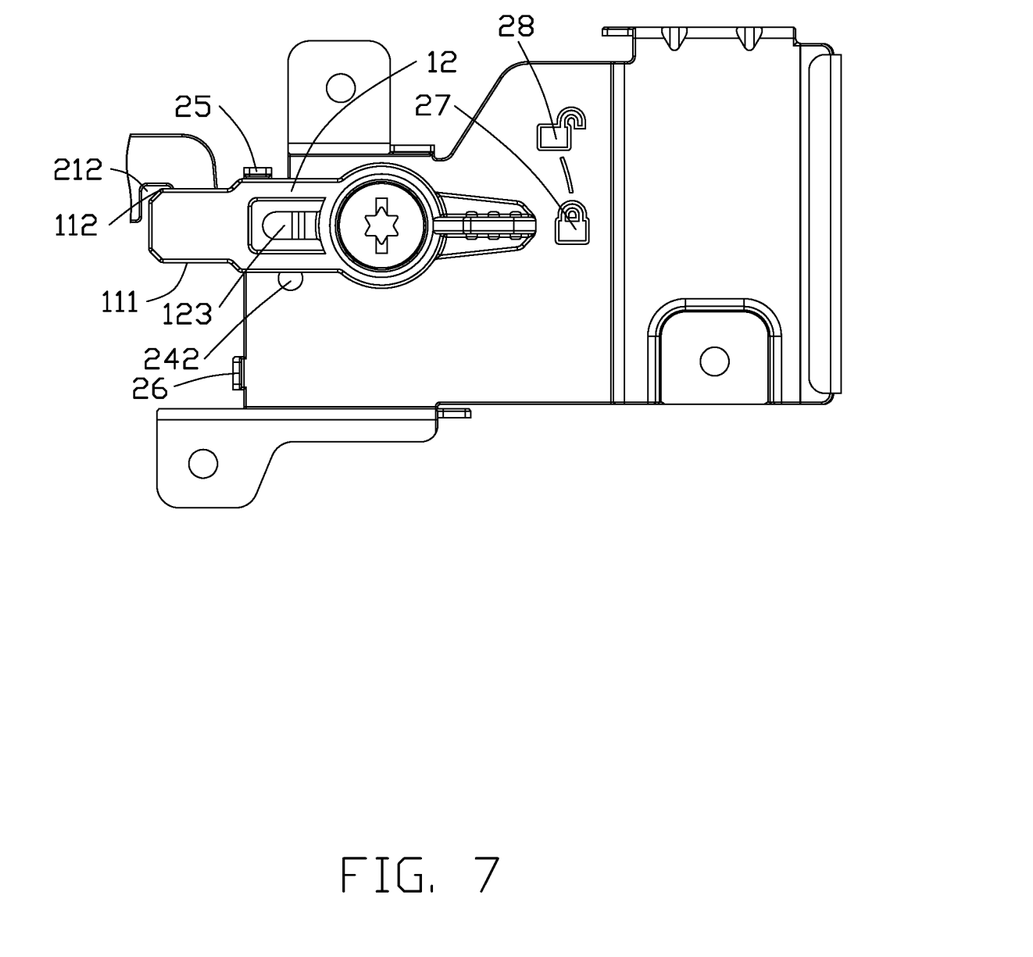
FIG. 7 is a schematic diagram of the securing apparatus in locked state.

FIGS. 6 and 7 illustrate that the bracket 20 is further provided with a lock mark 27 and an unlock mark 28. The lock mark 27 and the unlock mark 28 can be used to indicate the direction of rotation When the handle 14 is operated to move in the third direction, the clamping portion 11 and the positioning portion 12 of the locking member 10 move in a direction close to the fastening member 211. When the locking member 10 is fastened with the fastening member 211, the positioning portion 12 and the first blocking portion abut against each other, and the clamping hole 111 receives an end of the end portion 213 of the fastening member 211, the first hole wall 112 is limiting to the concave groove 212. At this time, the positioning member 124 is just received in the first positioning groove 241, and the locking member 10 and the fastening member 211 are in a fastening state. The third direction is a direction from the unlock mark 28 to the lock mark 27.

In the embodiment, when the handle 14 is operated to move in the fourth direction, the clamping portion 11 and the positioning portion 12 of the locking member 10 move in a direction away from the fastening member 211. When the locking member 10 is completely separated from the fastening member 211, that is, the positioning portion 12 and the second resisting portion 26 abut against each other, the positioning member 124 is just received in the second positioning groove 242, so that the locking member 10 and the fastening member 211 are in an unlocked state. In the embodiment, the fourth direction is a direction from the lock mark 27 to the unlock mark 28, and the fourth direction is opposite to the third direction.

In the embodiment, the first casing 210 can be a panel, and the second casing 220 can be a main casing with two sides open. The electronic device further includes a third casing (not shown), and the third casing is a side plate. The first casing 210 and the first mounting hole 230 cover both sides of the second casing 220 to complete the assembly of the electronic device 200. The first casing 210 and the second casing 220 are covered by the securing apparatus 100.

When the electronic device 200 is assembled by using the securing apparatus 100, the first casing 210 covers the second casing 220. The inside of the second casing 220 is provided with the securing apparatus 100 corresponding to the fastening member 211.

After the first casing 210 covers the second casing 220, the handle 14 is operated in the third direction, so that the end portion 213 of the fastening member 211 is received in the clamping hole 111, the first hole wall 112 is received in the concave groove 212 of the fastening member 211, and the first casing 210 and the second casing 220 are locked, then covering the third casing (not shown) on the second casing 220 to complete the assembly of the electronic device 200.

When the first casing 210 and the second casing 220 need to be unlocked, first open the third case (not shown), and then move the second casing 220 to the fourth direction. Operate the handle 14 so that the clamping hole 111 is away from the fastening member 211, and the first casing 210 and the second casing 220 are unlocked.

The securing apparatus 100 is not limited to use within the electronic device 200, it can also be applied to other equipment that needs to be assembled or equipment that needs to be fastened, such as door locking.

The fastening member 211 and the locking member 10 are not limited to the buckling cooperation between the hook and the clamping hole 111 as described, and may also be other buckling matching methods. For example, the fastening member 211 is provided with a fastening hole, and the locking member 10 is provided with a hook, thereby achieving the fastening. Alternatively, a first hook is provided on the fastening member 211, and a second cooperating hook is disposed on the locking member 10, so that the first hook and the second hook cooperate with each other to achieve clamping.

The securing apparatus 100 controls the buckling or disengagement of the fastening member 211 and the clamping hole 111 by operating the handle 14, thereby achieving disassembly without tools. In addition, the fastening member 211 is disposed inside the first casing 210, and the securing apparatus 100 is disposed inside the second casing 220, to render the electronic device 200 more aesthetic.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A securing apparatus configured for cooperating with a fastening member and comprising:
    a bracket; and
    a locking member rotatably disposing on the bracket; wherein the locking member comprises a clamping portion and a handle, a clamping hole of the clamping portion receives and engages the fastening member to enter into a fastened state; the locking member comprises a positioning member and a positioning portion, the positioning portion defines a positioning hole, the positioning hole is formed with a second hole wall, and a tongue piece is formed on the second hole wall, and the positioning member is formed at an end of the tongue piece; and the bracket defines a first positioning groove and a second positioning groove, the position member is received in the first positioning groove and the second positioning groove when in the fastened and an unfastened state respectively.

2. The securing apparatus according to claim 1, wherein the bracket comprises a first resisting portion and a second resisting portion, and the first resisting portion and the second resisting portion are configured to limit a rotation range and a rotation angle of the locking member.

3. The securing apparatus according to claim 1, wherein the clamping portion is configured to cooperate with the fastening member, and the clamping portion is fastened to or separated from the fastening member by rotating the locking member.

4. The securing apparatus according to claim 1, wherein the bracket comprises a lock mark and an unlock mark; wherein when the locking member is rotated from the lock mark towards the unlock mark, the locking member is in an unlocked state.

5. The securing apparatus according to claim 4, wherein when the locking member is rotated from the unlock mark towards the lock mark, the fastener is in a lock state.

6. The securing apparatus according to claim 1, wherein the locking member comprises a connecting member, the connecting member rotatably disposes the locking member on the bracket, and provides a rotation axis for the locking member to rotate relative to the bracket.

7. The securing apparatus according to claim 6, wherein the bracket defines a first mounting hole, the locking member further defines a second mounting hole, the connecting member extends through the second mounting hole and the first mounting hole, and the locking member is rotatably disposed on the bracket.

8. The securing apparatus according to claim 7, wherein the connecting member is a step screw.

9. An electronic device comprising:
    a first casing comprising a fastening member; and
    a second casing comprising a securing apparatus; wherein the electric device is lockable by fastening the fastening member to the securing apparatus;
    wherein the securing apparatus comprises a bracket and a locking member, the locking member is rotatably disposed on the bracket; and wherein the locking member comprises a clamping portion and a handle, a clamping hole of the clamping portion receives and engages the fastening member to enter into a fastened state; the locking member comprises a positioning member and a positioning portion, the positioning portion defines a positioning hole, the positioning hole is formed with a second hole wall, and a tongue piece is formed on the second hole wall, and the positioning member is formed at an end of the tongue piece; and the bracket defines a first positioning groove and a second positioning groove, the position member is received in the first positioning groove and the second positioning groove when in the fastened and an unfastened state respectively.

10. The electronic device according to claim 9, wherein the further comprises a first resisting portion and a second resisting portion, and the first resisting portion and the second resisting portion are configured to limit a rotation range and a rotation angle of the locking member.

11. The electronic device according to claim 9, wherein the clamping portion is configured to cooperate with the fastening member, and the clamping portion is fastened to or separated from the fastening member by rotating the locking member.

12. The electronic device according to claim 9, wherein the bracket comprises a lock mark and an unlock mark; wherein when the locking member is rotated from the lock mark towards the unlock mark, the locking member is in an unlocked state.

13. The electronic device according to claim 12, wherein when the locking member is rotated from the unlock mark towards the lock mark, the fastener is in a lock state.

14. The electronic device according to claim 9, wherein the locking member comprises a connecting member, the connecting member rotatably disposes the locking member on the bracket, and provides a rotation axis for the locking member to rotate relative to the bracket.

15. The electronic device according to claim 14, wherein the bracket defines a first mounting hole, the locking member defines a second mounting hole, the connecting member extends through the second mounting hole and the first mounting hole, and the locking member is rotatably disposed on the bracket.

16. The electronic device according to claim 15, wherein the connecting member is a step screw.

* * * * *